US007205083B2

(12) United States Patent
Takeuchi et al.

(10) Patent No.: US 7,205,083 B2
(45) Date of Patent: Apr. 17, 2007

(54) RECORDING MATERIAL

(75) Inventors: Yohsuke Takeuchi, Shizuoka-ken (JP); Yoshimitsu Arai, Shizuoka-ken (JP); Naoto Yanagihara, Shizuoka-ken (JP)

(73) Assignee: Fujifilm Corporation, Tokyo (JP)

(*) Notice: Subject to any disclaimer, the term of this patent is extended or adjusted under 35 U.S.C. 154(b) by 140 days.

(21) Appl. No.: 10/690,779

(22) Filed: Oct. 23, 2003

(65) Prior Publication Data

US 2004/0082472 A1 Apr. 29, 2004

(30) Foreign Application Priority Data

Oct. 23, 2002 (JP) ............................. 2002-308444

(51) Int. Cl.
*G03F 7/021* (2006.01)

(52) U.S. Cl. ........................ 430/138; 430/157; 430/176

(58) Field of Classification Search ................ 430/157, 430/176, 138

See application file for complete search history.

(56) References Cited

U.S. PATENT DOCUMENTS

| | | | | |
|---|---|---|---|---|
| 3,883,504 A * | 5/1975 | Schickfluss et al. | ........ | 534/829 |
| 4,540,648 A * | 9/1985 | Scheler | ........................ | 430/172 |

FOREIGN PATENT DOCUMENTS

| | | |
|---|---|---|
| JP | 4-135787 A | 5/1992 |
| JP | 4-144784 A | 5/1992 |
| JP | 2001-139563 A | 5/2001 |
| JP | 2001-151762 A | 6/2001 |
| JP | 2002-003738 A | 1/2002 |

OTHER PUBLICATIONS

Pierrot, Francois et al "Coupling of diazonium salts with 2-methylbenzothiazoles", pp. 1049-1051, 1954.*

* cited by examiner

*Primary Examiner*—John S. Chu
(74) *Attorney, Agent, or Firm*—Sughrue Mion, PLLC

(57) ABSTRACT

A recording material comprises, on a support, a recording layer including a diazo compound, a coupler compound that can react with the diazo compound to form a color, and a metal salt, wherein the coupler compound is represented by the general formula (1):

General Formula (1)

General formula (1)

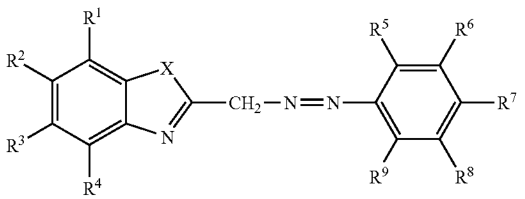

wherein $R^1$, $R^2$, $R^3$, and $R^4$ each independently represent a hydrogen atom, an alkyl group, an aryl group, an alkoxy group, or an amino group; $R^5$, $R^6$, $R^7$, $R^8$, and $R^9$ each independently represent a hydrogen atom, a halogen atom, an alkyl group, an aryl group, an alkoxy group, an aryloxy group, an alkylthio group, an arylthio group, an alkylsulfonyl group, an arylsulfonyl group, an alkoxycarbonyl group, an aryloxycarbonyl group, an acyloxy group, an acyl group, a carbamoyl group, an acylamino group, a sulfamoyl group, a sulfonamide group, a cyano group, or a nitro group; and X represents an oxygen atom or a sulfur atom.

19 Claims, No Drawings

RECORDING MATERIAL

CROSS-REFERENCE TO RELATED APPLICATION

This application claims priority under 35 USC 119 from Japanese Patent Application No. 2002-308444, the disclosure of which is incorporated by reference herein.

BACKGROUND OF THE INVENTION

1. Field of the Invention

The present invention relates to a recording material such as a thermal recording material and a pressure-sensitive recording material, which includes a diazo compound, a coupler compound that can react with the diazo compound to form a color, and a metal salt. Specifically, the present invention relates to a recording material that can form a vivid color image ranging from violet to cyan hues.

2. Description of the Related Art

With the development of High-performance recording materials such as high-performance thermal or pressure-sensitive recording materials, there has been a great demand for a thermal recording material that can form a vivid color image ranging from violet to cyan hues and also has excellent in shelf life and image storage stability (image storability).

Diazo compounds react with the so-called coupler compounds such as phenol derivatives and active methylene group-containing compounds to form azo dyes. The diazo compounds are also decomposed by light radiation and thus lose their activity. Based on such properties, the diazo compounds have been utilized since early times as optical recording materials typified by diazo copying materials. For example, such applications are disclosed in "Fundamentals of Photographic Engineering, Edition of Non-Silver Salt Photography" edited by the Japan Photographic Association, published by CORONA PUBLISHING, Ltd., 1982, pp. 89–117 and 182–201.

Lately, the diazo compounds have also been applied to recording materials for processes involving image fixing. Typical examples of such recording materials include light-fixation type thermal recording materials, which comprise a diazo compound and a coupler compound. In such materials, the diazo compound and the coupler compound are heated in response to image signals to react with each other, so that images are formed, and then the images are fixed by light radiation. For example, such materials are described in Kohji Sato et al., J. Image Electronic Society, Vol. 11, No. 4, 1982, pp. 290–296.

Even in dark places, however, diazo compounds in such recording materials gradually thermally decompose and thus lose their reactivity. Therefore, such recording materials have the disadvantage of having a short shelf life. In order to overcome such a disadvantage, diazo compounds may be encapsulated in microcapsules so as to be separated from decomposition-causing materials such as water and bases. Such a technique is disclosed in Toshimasa Usami et al., J. Electrophotography Association, Vol. 26, No. 2, 1987, pp. 115–125. Such a technique can dramatically improve the shelf life of the recording material.

Further, the microcapsule has a glass transition temperature higher than room temperature, the wall of the capsule is non-permeable to substances at room temperature. Furthermore, such a microcapsule is permeable to substances at a temperature higher than the glass transition temperature. For this reason such a microcapsule can be thermally responsive and can therefore be used for a thermal recording material. Specifically, a thermal recording material can be produced by forming, on a support, a thermal recording layer that includes diazo compound-containing thermally responsive microcapsules, a coupler compound and the like. Such a thermal recording material can (1) provide long storage stability for the diazo compound, (2) form thermal coloring images, and (3) provide image fixation by light radiation.

In recent years, attempts have been made to develop recording materials that can perform sophisticated functions. Functional materials have become widespread, such as recording materials that can form multi-color images, as disclosed in Japanese Patent Applications Laid-Open (JP-A) Nos. 4-135787 and 4-144784. Under such circumstances, there have been demands for further improvements in performance, particularly demands for good coloring hues for images and demands for improvement in the resistance of image portions to light.

SUMMARY OF THE INVENTION

The present invention has been made for the purpose of meeting the above-mentioned demands and achieving the object below. It is an object of the present invention to provide a recording material that can form high-quality images of color hues ranging violet to cyan.

A first aspect of the present invention is to provide a recording material comprising: on a support, a recording layer including a diazo compound, a coupler compound that can react with the diazo compound to form a color, and a metal salt, wherein the coupler compound is represented by the following general formula (1):

General formula (1)

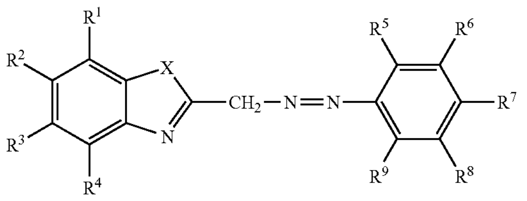

wherein $R^1$, $R^2$, $R^3$, and $R^4$ each independently represent a hydrogen atom, an alkyl group, an aryl group, an alkoxy group, or an amino group; $R^5$, $R^6$, $R^7$, $R^8$, and $R^9$ each independently represent a hydrogen atom, a halogen atom, an alkyl group, an aryl group, an alkoxy group, an aryloxy group, an alkylthio group, an arylthio group, an alkylsulfonyl group, an arylsulfonyl group, an alkoxycarbonyl group, an aryloxycarbonyl group, an acyloxy group, an acyl group, a carbamoyl group, an acylamino group, a sulfamoyl group, a sulfonamide group, a cyano group, or a nitro group; any of $R^1$ to $R^9$ may have a substituent; and X represents an oxygen atom or a sulfur atom.

DETAILED DESCRIPTION OF THE PREFERRED EMBODIMENTS

The recording material of the present invention comprises a recording layer that includes a diazo compound, a coupler compound represented by the general formula (1), and a metal salt. Examples of the recording material of the invention include a thermal recording material, which has a thermal recording layer and whose coloring system is formed by heat, a pressure-sensitive recording material, which has a pressure-sensitive recording layer and whose color is formed by pressure, and a photo-thermal sensitive recording material, which forms a latent image by light and whose color is formed by heat. The recording material of the invention is specifically described below by taking as examples recording materials having the thermal recording layer (thermal recording materials). However, the scope of the invention is not limited to such thermal recording materials.

Recording Material

The recording material of the invention has at least one recording layer on a support. If necessary, the recording material of the invention may have any other layer such as a protective layer and an intermediate layer.

Recording Layer

In the present invention, the recording layer comprises a diazo compound, a coupler compound that can react with the diazo compound to form a color, and a metal salt. If necessary, the recording layer may comprise any other component.

Coupler Compound

The coupler compound, which is included in the recording layer of the recording material of the invention, reacts with the diazo compound and the metal salt to produce a color ranging from violet to cyan hues. According the present invention, the recording layer includes at least one of the compounds represented by the general formula (1) (hereinafter, also referred to as the coupler compound of the present invention). Specifically, the coupler compound of the invention may be used in combination with the benzotriazinone type diazo compound as described below (the diazo compound represented by the general formula (2)) so that a vivid color can be produced in the color hues ranging from violet to cyan.

General formula (1)

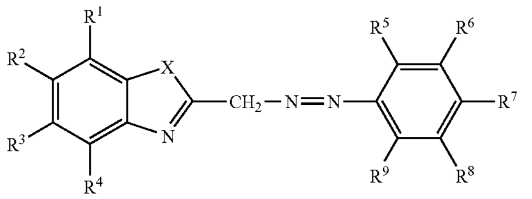

wherein $R^1$, $R^2$, $R^3$, and $R^4$ each independently represent a hydrogen atom, an alkyl group, an aryl group, an alkoxy group, or an amino group; $R^5$, $R^6$, $R^7$, $R^8$, and $R^9$ each independently represent a hydrogen atom, a halogen atom, an alkyl group, an aryl group, an alkoxy group, an aryloxy group, an alkylthio group, an arylthio group, an alkylsulfonyl group, an arylsulfonyl group, an alkoxycarbonyl group, an aryloxycarbonyl group, an acyloxy group, an acyl group, a carbamoyl group, an acylamino group, a sulfamoyl group, a sulfonamide group, a cyano group, or a nitro group; any of $R^1$ to $R^9$ may have a substituent; and X represents an oxygen atom or a sulfur atom.

The alkyl group represented by $R^1$, $R^2$, $R^3$, or $R^4$ may be a straight or branched chain and may have an unsaturated bond. Such an alkyl group may be an unsubstituted alkyl group. Alternatively, such an alkyl group may have a substituent such as an alkoxy group, an aryloxy group, an alkoxycarbonyl group, an aryloxycarbonyl group, an aryl group (wherein any of these groups may further have a substituent such as an alkyl group, an alkoxy group, a nitro group, a cyano group, a hydroxy group, and a halogen atom), a hydroxy group, and a halogen atom.

The alkyl group preferably has 1 to 30 total carbon atoms. Examples of the alkyl group include methyl, trifluoromethyl, ethyl, butyl, hexyl, octyl, 2-ethylhexyl, decyl, dodecyl, octadecyl, propyl, isopropyl, isobutyl, sec-butyl, tert-butyl, pentyl, 1-ethylpentyl, cyclopentyl, cyclohexyl, isopentyl, heptyl, nonyl, undecyl, propenyl, heptadecenyl, tert-octyl, ethoxycarbonylmethyl, butoxycarbonylmethyl, 2-ethylhexyloxycarbonylmethyl, 1-(ethoxycarbonyl)ethyl, 2',4'-diisopentylphenyloxymethyl, 2',4'-di-tert-butylphenyloxymethyl, ethoxycarbonylethyl, 2-ethylhexyloxycarbonylethyl, butyldecyloxycarbonylethyl, dibutylaminocarbonylmethyl, dibenzylaminocarbonylethyl, ethyloxycarbonylpropyl, 2-ethylhexyloxycarbonylpropyl, 2,4-di-tert-amylphenyloxypropyl, 1-(2',4'-di-tert-amylphenyloxy)propyl, 2,4-di-tert-butylphenyloxypropyl, acetylaminoethyl, N,N-dihexylaminocarbonylethyl, 2,4-di-tert-amyloxyethyloxycarbonylpropyl, isostearyloxycarbonylpropyl, 1-(2,4-di-tert-pentylphenyloxy)propyl, 2,4-di-tert-pentylphenyloxyethyloxycarbonylpropyl, naphthyloxyethyloxycarbonylethyl, N-methyl-N-phenylaminoethyloxycarbonylethyl, and methanesulfonylaminopropyl.

In particular, the alkyl group more preferably has 1 to 20 total carbon atoms. Particularly preferred examples of the alkyl group include methyl, trifluoromethyl, octyl, tert-butyl, nonyl, and 1-(2',4'-di-tert-amylphenyloxy)propyl.

The aryl group represented by $R^1$, $R^2$, $R^3$, or $R^4$ may be an unsubstituted aryl group. Alternatively, the aryl group may have a substituent such as an alkyl group, an alkoxy group, an aryloxy group, a halogen atom, a nitro group, a cyano group, a carbamoyl group, a sulfamoyl group, an amino group, an alkylthio group, an arylthio group, an alkylsulfonyl group, an arylsulfonyl group, an aryl group, a hydroxy group, an acyl group, an acyloxy group, an aminocarbonyloxy group, a phosphoryloxy group, and an alkoxycarbonyl group.

The aryl group preferably has 6 to 30 total carbon atoms. Examples of the aryl group include phenyl, 2-methylphenyl, 2-chlorophenyl, 2-methoxyphenyl, 2-ethoxyphenyl, 2-propoxyphenyl, 2-isopropoxyphenyl, 2-butoxyphenyl, 2-(2-ethylhexyloxy)phenyl, 2-octyloxyphenyl, 2-decyloxyphenyl, 2-undecyloxyphenyl, 2-trifluoromethylphenyl, 2-(2-ethylhexyloxy)-5-chlorophenyl, 2-(2-ethylhexyloxy)-3,5-dichlorophenyl, 3-(2,4-di-tert-pentylphenoxyethoxy)phenyl, 2-(dibutylaminocarbonylethoxy)phenyl, 2,4-dichlorophenyl, 2,5-dichlorophenyl, 2,4,6-trimethylphenyl, 3-chlorophenyl, 3-nitrophenyl, 3-cyanophenyl, 3-trifluoromethylphenyl, 3-methoxyphenyl, 3-ethoxyphenyl, 3-butoxyphenyl, 3-(2-ethylhexyloxy)phenyl, 3,4-dichlorophenyl, 3,5-dichlorophenyl, 3,4-dimethoxyphenyl, 3,5-dibutoxyphenyl, 3-octyloxyphenyl, 3-(dibutylaminocarbonylmethoxy)phenyl, 3-(di-2-ethylhexylaminocarbonylmethoxy)phenyl, 3-dodecyloxyphenyl, 4-chlorophenyl, 4-cyanophenyl, 4-nitrophenyl, 4-trifluoromethylphenyl, 4-methoxyphenyl, 4-ethoxyphenyl, 4-isopropoxyphenyl, 4-butoxyphenyl, 4-(2-ethylhexyloxy)phenyl, 4-isopentyloxyphenyl, 4-decyloxyphenyl, 4-(octadecyloxy)phenyl, 4-benzylphenyl, 4-aminosulfonylphenyl, 4-N,N-dibutylaminosulfonylphenyl, 4-ethoxycarbonylphenyl, 4-(2-ethylhexyloxycarbonyl)phenyl, 4-tert-octylphenyl, 4-fluorophenyl, 3-acetylphenyl, 2-acetylaminophenyl, 2,4-di-tert-pentylphenyl, 4-methylthiophenyl, and 4-(4-chlorophenylthio)phenyl, and hydroxyphenyl, phenylsulfonylphenyl, phenylcarbonyloxyphenyl, dimethylaminocarbonyloxypheny, and butylcarbonyloxyphenyl.

In particular, the aryl group more preferably has 6 to 24 total carbon atoms. Particularly preferred examples of the aryl group include phenyl, 3-octyloxyphenyl, 3-dodecyloxyphenyl, 4-trifluoromethylphenyl, and 4-tert-octylphenyl.

The alkoxy group represented by $R^1$, $R^2$, $R^3$, or $R^4$ preferably has 1 to 30 total carbon atoms. Examples of the alkoxy group include methoxy, ethoxy, propyloxy, isopropyloxy, butoxy, isobutoxy, sec-butoxy, tert-butoxy, pentyloxy, isopentyloxy, hexyloxy, heptyloxy, octyloxy, 2-ethylhexyloxy, decyloxy, dodecyloxy, octadecyloxy, ethoxycarbonylmethyloxy, 2-ethylhexyloxycarbonylmethyloxy, aminocarbonylmethyloxy, N,N-dibutylaminocarbonylmethyloxy, N-methylaminocarbonylmethyloxy, N-ethylaminocarbonylmethyloxy, N-octylaminocarbonylmethyloxy, N-methyl-N-benzylaminocarbonylmethyloxy, benzyloxy, and cyanomethyloxy.

In particular, the alkoxy group more preferably has 1 to 12 total carbon atoms. Particularly preferred examples of the alkoxy group include methoxy, ethoxy, butoxy, and 2-ethylhexyloxy.

The amino group represented by $R^1$, $R^2$, $R^3$, or $R^4$ may have a substituent. Examples of the amino group include an amino group, an N-alkylamino group, an N-arylamino group, an N-acylamino group, an N-sulfonylamino group, an N,N-dialkylamino group, an N,N-diarylamino group, an N-alkyl-N-arylamino group, and an N,N-disulfonylamino group.

The amino group having the substituent preferably has 1 to 50 carbon atoms. Examples of the amino group having the substituent include N-methylamino, N-ethylamino, N-propylamino, N-isopropylamino, N-tert-butylamino, N-hexylamino, N-cyclohexylamino, N-octylamino, N-(2-ethylhexyl)amino, N-decylamino, N-octadecylamino, N-benzylamino, N-phenylamino, N-(2-methylphenyl)amino, N-(2-chlorophenyl)amino, N-(2-methoxyphenyl)amino, N-(2 isopropoxyphenyl)amino, N-(2-(2-ethylhexyloxy)phenyl)amino, N-(3-chlorophenyl)amino, N-(3-nitrophenyl)amino, N-(3-cyanophenyl)amino, N-(4-methoxyphenyl)amino, N-(4-(2-ethylhexyloxy)phenyl)amino, N-(4-cyanophenyl)amino, N-methyl-N-phenylamino, N,N-dimethylamino, N,N-dibutylamino, N,N-diphenylamino, N,N-diacetylamino, N,N-dibenzoylamino, N,N-di(butylcarbonyl)amino, N,N-di(2-ethylhexylcarbonyl)amino, N,N-di(methylsulfonyl)amino, N,N-di(ethylsulfonyl)amino, N,N-di(butylsulfonyl)amino, N,N-di(2-ethylhexylsulfonyl)amino, N,N-di(phenylsulfonyl)amino, N-acetylamino, N-pivaloylamino, N-(2-ethylhexanoyl)amino, N-benzoylamino, N-hexyloxycarbonylamino, N-methylsulfonylamino, and N-phenylsulfonylamino.

Particularly preferred examples of the amino group include amino, N-pivaloylamino, and N-phenylsulfonylamino.

The halogen atom represented by $R^5$, $R^6$, $R^7$, $R^8$, or $R^9$ may be a fluorine atom, a chlorine atom, a bromine atom, or the like and preferably be a fluorine atom or a chlorine atom.

Examples of the alkyl, aryl or alkoxy group represented by $R^5$, $R^6$, $R^7$, $R^8$, or $R^9$ may be the same as the examples of $R^1$, $R^2$, $R^3$, or $R^4$. The number of the total carbon atoms and desirable examples thereof may also be the same.

The aryloxy group represented by $R^5$, $R^6$, $R^7$, $R^8$, or $R^9$ preferably has 6 to 30 total carbon atoms. Examples of the aryloxy group include phenyloxy, 1-naphthyloxy, 2-naphthyloxy, 2-chlorophenyloxy, 2-methylphenyloxy, 2-methoxyphenyloxy, 2-butoxyphenyloxy, 3-chlorophenyloxy, 3-trifluoromethylphenyloxy, 3-cyanophenyloxy, 3-(2-ethylhexyloxy)phenyloxy, 3-nitrophenyloxy, 4-fluorophenyloxy, 4-cyanophenyloxy, 4-butoxyphenyloxy, 4-(2-ethylhexyloxy)phenyloxy, and 4-octadecylphenyloxy.

In particular, the aryloxy group more preferably has 6 to 12 total carbon atoms. Particularly preferred examples of the aryloxy group include phenyloxy, 2-methylphenyloxy and 2-methoxyphenyloxy.

The alkylthio group represented by $R^5$, $R^6$, $R^7$, $R^8$, or $R^9$ preferably has 1 to 30 total carbon atoms. Examples of the alkylthio group include methylthio, ethylthio, propylthio, isopropylthio, butylthio, isobutylthio, secbutylthio, tert-butylthio, pentylthio, isopentylthio, hexylthio, heptylthio, octylthio, 2-ethylhexylthio, decylthio, dodecylthio, octadecylthio, ethoxycarbonylmethylthio, 2-ethylhexyloxycarbonylmethylthio, aminocarbonylmethylthio, N,N-dibutylaminocarbonylmethylthio, N-methylaminocarbonylmethylthio, N-ethylaminocarbonylmethylthio, N-octylaminocarbonylmethylthio, N-methyl-N-benzylaminocarbonylmethylthio, benzylthio, and cyanomethylthio.

In particular, the alkylthio group more preferably has 1 to 12 total carbon atoms. Particularly preferred examples of the alkylthio group include methylthio, ethylthio, butylthio, and 2-ethylhexylthio.

The arylthio group represented by $R^5$, $R^6$, $R^7$, $R^8$, or $R^9$ preferably has 6 to 30 total carbon atoms. Examples of the arylthio group include phenylthio, 1-naphthylthio, 2-naphthylthio, 2-chlorophenylthio, 2-methylphenylthio, 2-methoxyphenylthio, 2-butoxyphenylthio, 3-chlorophenylthio, 3-trifluoromethylphenylthio, 3-cyanophenylthio, 3-(2-ethylhexyloxy)phenylthio, 3-nitrophenylthio, 4-fluorophenylthio, 4-cyanophenylthio, 4-butoxyphenylthio, 4-(2-ethylhexyloxy)phenylthio, and 4-octadecylphenylthio.

In particular, the arylthio group more preferably has 6 to 12 total carbon atoms. Particularly preferred examples of the arylthio group include phenylthio, 2-methylphenylthio, 2-methoxyphenylthio, and 4-butoxyphenylthio.

The alkylsulfonyl group represented by $R^5$, $R^6$, $R^7$, $R^8$, or $R^9$ preferably has 1 to 20 total carbon atoms. Examples of the alkylsulfonyl group include methylsulfonyl, ethylsulfonyl, propylsulfonyl, isopropylsulfonyl, butylsulfonyl, hexylsulfonyl, cyclohexylsulfonyl, octylsulfonyl, 2-ethylhexylsulfonyl, decanoylsulfonyl, dodecanoylsulfonyl, octadecanoylsulfonyl, and cyanomethylsulfonyl.

In particular, the alkylsulfonyl group more preferably has 1 to 12 total carbon atoms. Particularly preferred examples of the alkylsulfonyl group include methylsulfonyl and octylsulfonyl.

The arylsulfonyl group represented by $R^5$, $R^6$, $R^7$, $R^8$, or $R^9$ preferably has 6 to 30 total carbon atoms. Examples of the arylsulfonyl group include phenylsulfonyl, 1-naphthylsulfonyl, 2-naphthylsulfonyl, 2-chlorophenylsulfonyl, 2-methylphenylsulfonyl, 2-methoxyphenylsulfonyl, 2-butoxyphenylsulfonyl, 3-chlorophenylsulfonyl, 3-trifluoromethylphenylsulfonyl, 3-cyanophenylsulfonyl, 3-(2-ethylhexyloxy)phenylsulfonyl, 3-nitrophenylsulfonyl, 4-fluorophenylsulfonyl, 4-cyanophenylsulfonyl, 4-butoxyphenylsulfonyl, 4-(2-ethylhexyloxy)phenylsulfonyl, and 4-octadecylphenylsulfonyl.

In particular, the arylsulfonyl group more preferably has 6 to 12 total carbon atoms. Particularly preferred examples of the arylsulfonyl group include phenylsulfonyl and 4-butoxyphenylsulfonyl.

The alkoxycarbonyl group represented by $R^5$, $R^6$, $R^7$, $R^8$, or $R^9$ preferably has 2 to 20 total carbon atoms. Examples of the alkoxycarbonyl group include methoxycarbonyl, ethoxycarbonyl, propoxycarbonyl, butoxycarbonyl, hexyloxycarbonyl, 2-ethylhexyloxycarbonyl, octyloxycarbonyl, decyloxycarbonyl, octadecyloxycarbonyl, phenyloxyethyloxycarbonyl, phenyloxypropyloxycarbonyl, 2,4-di-tert-amylphenyloxyethylcarbonyl, 2,6-di-tert-butyl-4-methylcyclohexyloxycarbonyl, and isostearyloxycarbonyl.

In particular, the alkoxycarbonyl group more preferably has 2 to 12 total carbon atoms. Particularly preferred examples of the alkoxycarbonyl group include methoxycarbonyl, ethoxycarbonyl and octyloxycarbonyl.

The aryloxycarbonyl group represented by $R^5$, $R^6$, $R^7$, $R^8$, or $R^9$ preferably has 7 to 30 total carbon atoms. Examples of the aryloxycarbonyl group include 2-methylphenyloxycarbonyl, 2-chlorophenyloxycarbonyl, 2,6-dimethylphenyloxycarbonyl, 2,4,6-trimethylphenyloxycarbonyl, 2-methoxyphenyloxycarbonyl, 2-butoxyphenyloxycarbonyl, 3-cyanophenyloxycarbonyl, 3-nitrophenyloxycarbonyl, 2-(2-ethylhexyl)phenyloxycarbonyl, 3-(2-ethylhexyloxy) phenyloxycarbonyl, 4-fluorophenyloxycarbonyl, 4-chlorophenyloxycarbonyl, 4-cyanophenyloxycarbonyl, and 4-butoxyphenyloxycarbonyl.

In particular, the aryloxycarbonyl group more preferably has 7 to 20 total carbon atoms. Particularly preferred examples of the aryloxycarbonyl group include 2-methylphenyloxycarbonyl and 2-methoxyphenyloxycarbonyl.

The acyloxy group represented by $R^5$, $R^6$, $R^7$, $R^8$, or $R^9$ preferably has 2 to 20 total carbon atoms. Examples of the acyloxy group include acetyloxy, propanoyloxy, butanoyloxy, pentanoyloxy, trifluoromethylcarbonyloxy, octanoyloxy, decanoyloxy, undecanoyloxy, and octadecanoyloxy.

In particular, the acyloxy group more preferably has 2 to 12 total carbon atoms. Particularly preferred examples of the acyloxy group include acetyloxy and octanoyloxy.

The acyl group represented by $R^5$, $R^6$, $R^7$, $R^8$, or $R^9$ preferably has 2 to 20 total carbon atoms. Examples of the acyl group include acetyl, propanoyl, butanoyl, hexanoyl, octanoyl, 2-ethylhexanoyl, decanoyl, dodecanoyl, octadecanoyl, 2-cyanopropanoyl, and 1,1-dimethylpropanoyl.

In particular, the acyl group more preferably has 2 to 12 total carbon atoms. Particularly preferred examples of the acyl group include acetyl and 2-ethylhexanoyl.

The carbamoyl group represented by $R^5$, $R^6$, $R^7$, $R^8$, or $R^9$ may be unsubstituted or substituted. Examples of the carbamoyl group include carbamoyl, N-alkylcarbamoyl, N-arylcarbamoyl, N,N-dialkylcarbamoyl, N,N-diarylcarbamoyl, and N-alkyl-N-arylcarbamoyl.

The substituted carbamoyl group preferably has 2 to 30 total carbon atoms. Examples of the substituted carbamoyl group include N-methylcarbamoyl, N-ethylcarbamoyl, N-propylcarbamoyl, N-butylcarbamoyl, N-hexylcarbamoyl, N-cyclohexylcarbamoyl, N-octylcarbamoyl, N-2-ethylhexylcarbamoyl, N-decylcarbamoyl, N-octadecylcarbamoyl, N-phenylcarbamoyl, N-(2-methylphenyl)carbamoyl, N-(2-chlorophenyl)carbamoyl, N-(2-methoxyphenyl)carbamoyl, N-(2-isopropoxyphenyl)carbamoyl, N-(2-(2-ethylhexyloxy) phenyl)carbamoyl, N-(3-chlorophenyl)carbamoyl, N-(3-nitrophenyl)carbamoyl, N-(3-cyanophenyl)carbamoyl, N-(4-methoxyphenyl)carbamoyl, N-4-(2-ethylhexyloxy)phenyl) carbamoyl, N-(4-cyanophenyl)carbamoyl, N-methyl-N-phenylcarbamoyl, N,N-dimethylcarbamoyl, N,N-dibutylcarbamoyl, N,N-diphenylcarbamoyl, N-toluenesulfonylcarbamoyl, and N-hexylsulfonylcarbamoyl.

In particular, N-toluenesulfonylcarbamoyl is preferred.

The acylamino group represented by $R^5$, $R^6$, $R^7$, $R^8$, or $R^9$ may be unsubstituted or substituted. The acylamino group preferably has 2 to 20 total carbon atoms. Preferred examples of the acylamino group include acetylamino, propanoylamino, butanoylamino, hexanoylamino, octanoylamino, 2-ethylhexanoylamino, benzoylamino, 4-methoxybenzoylamino, N-methylacetylamino, N-methylbenzoylamino, and 2-oxapyrrolidino.

In particular, the acylamino group more preferably has 2 to 12 total carbon atoms. Particularly preferred examples of the acylamino group include acetylamino and octanoylamino.

The sulfamoyl group represented by $R^5$, $R^6$, $R^7$, $R^8$, or $R^9$ may be unsubstituted or substituted. Examples of the sulfamoyl group include sulfamoyl, N-alkylsulfamoyl, N-arylsulfamoyl, N,N-dialkylsulfamoyl, N,N-diarylsulfamoyl, and N-alkyl-N-arylsulfamoyl. In particular, N,N-dialkylsulfamoyl is preferred.

The substituted sulfamoyl group preferably has 1 to 30 total carbon atoms. Examples of the substituted sulfamoyl group include N-methylsulfamoyl, N-ethylsulfamoyl, N-propylsulfamoyl, N-butylsulfamoyl, N-hexylsulfamoyl, N-cyclohexylsulfamoyl, N-octylsulfamoyl, N-(2-ethylhexyl)sulfamoyl, N-decylsulfamoyl, N-octadecylsulfamoyl, N-phenylsulfamoyl, N-(2-methylphenyl)sulfamoyl, N-(2-chlorophenyl)sulfamoyl, N-(2-methoxyphenyl)sulfamoyl, N-(2-isopropoxyphenyl)sulfamoyl, N-(2-(2-ethylhexyloxy) phenyl)sulfamoyl, N-(3-chlorophenyl)sulfamoyl, N-(3-nitrophenyl)sulfamoyl, N-(3-cyanophenyl)sulfamoyl, N-(4-methoxyphenyl)sulfamoyl, N-(4-(2-ethylhexyloxy)phenyl) sulfamoyl, N-(4-cyanophenyl)sulfamoyl, N-methyl-N-phenylsulfamoyl, N,N-dimethylsulfamoyl, N,N-dibutylsulfamoyl, N,N-diphenylsulfamoyl, and N,N-di-(2-ethylhexyl)sulfamoyl.

In particular, N,N-dimethylsulfamoyl and N,N-dibutylsulfamoyl are preferred.

The sulfonamide group represented by $R^5$, $R^6$, $R^7$, $R^8$ or $R^9$ may be unsubstituted or substituted. The sulfonamide group preferably has 1 to 20 total carbon atoms. Preferred examples of the sulfonamide group include methanesulfonamide, ethanesulfonamide, butanesulfonamide, hexanesulfonamide, benzenesulfonamide, 4-methoxybenzenesulfonamide, and N-methylmethanesulfonamide.

$R^1$, $R^2$, $R^3$, or $R^4$ is more preferably a hydrogen atom, an alkyl group or an alkoxy group, particularly preferably a hydrogen atom or an alkoxy group. $R^5$, $R^6$, $R^7$, $R^8$, or $R^9$ is more preferably a hydrogen atom, a halogen atom, an alkyl group, an aryl group, an alkoxy group, an alkoxycarbonyl group, or an acyl group, particularly preferably a hydrogen atom, a halogen atom, an alkyl group, an aryl group, or an alkoxy group.

Some examples of the compound represented by the general formula (1) are shown below (Illustrative Compounds B-1 to B-24). However, such compounds are not intended to limit the scope of the invention.

B-1

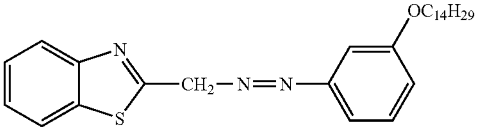

B-2

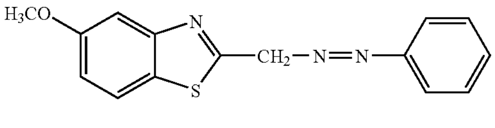

-continued
B-3
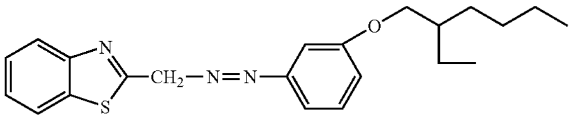
B-4
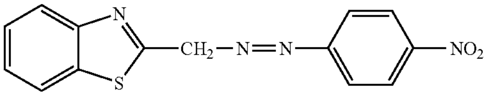
B-5
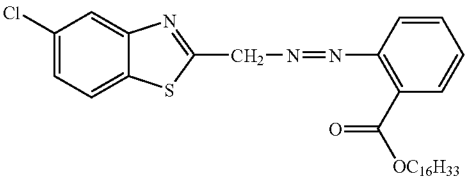
B-6
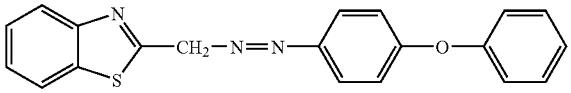
B-7
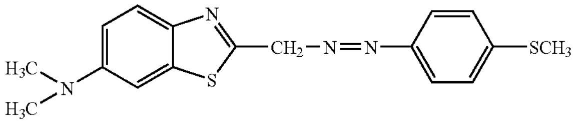
B-8
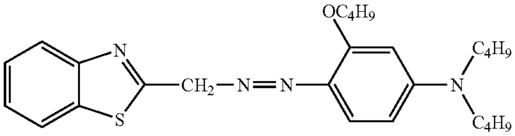
B-9
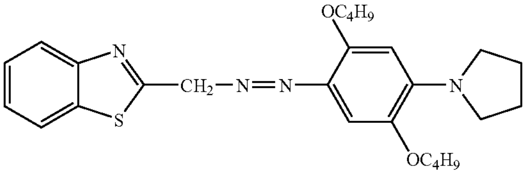
B-10
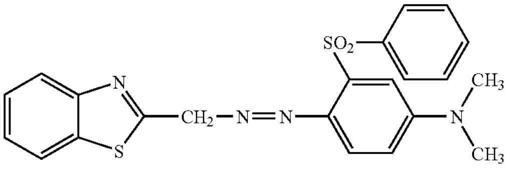
B-11
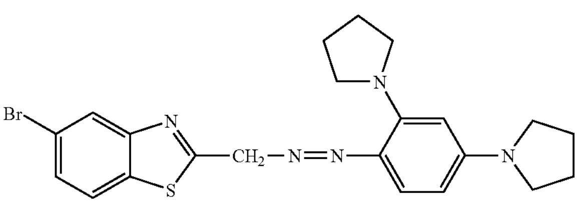
-continued
B-12
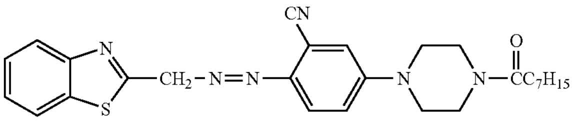
B-13
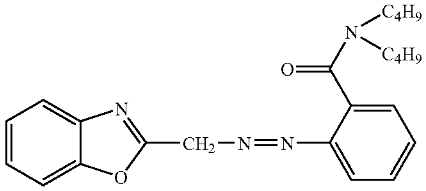
B-14
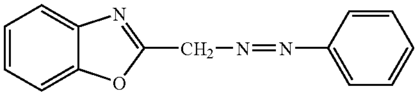
B-15
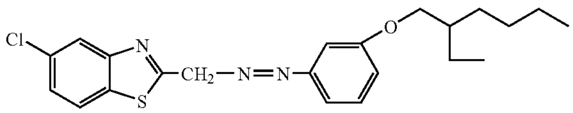
B-16
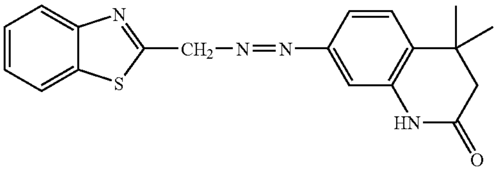
B-17
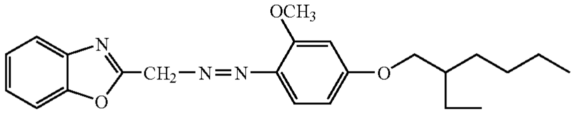
B-18
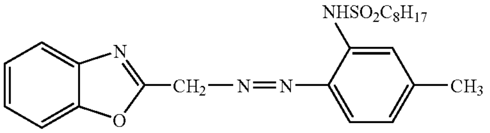
B-19
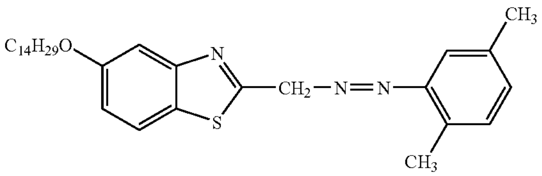
B-20
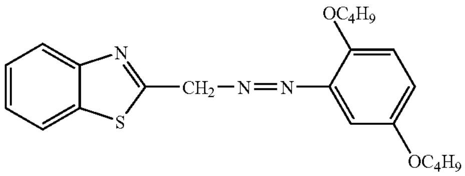
B-21
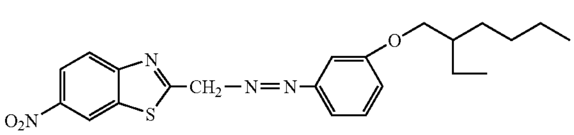

-continued

B-22

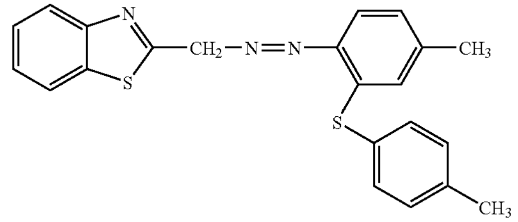

B-23

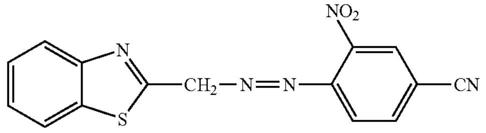

B-24

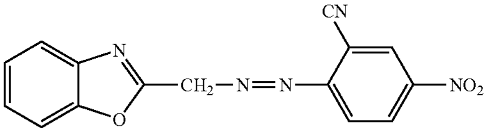

The compound represented by the general formula (1) can appropriately be synthesized according to the process as disclosed in Justus Liebigs Ann. Chem., 537, 53, and 1939.

The compound represented by the general formula (1) may be used alone or in combination of plural types. In the present invention, the compound represented by the general formula (1) may be used in combination with any other known coupler compound, depending on a variety of objects such as color hue control. Preferred examples of the known coupler compound include so-called active methylene compounds, phenols and naphthols. Specific examples of such compounds include the compounds as shown below.

Particularly preferred examples of the known coupler compound include resorcin, phloroglucine, 2,3-dihydroxynaphthalene, sodium 2,3-dihydroxynaphthalene-6-sulfonate, 1-hydroxy-2-naphthoic acid morpholinopropylamide, sodium 2-hydroxy-3-naphthalenesolfonate, 2-hydroxy-3-naphthalenesulfonic acid anilide, 2-hydroxy-3-naphthalenesulfonic acid morpholinopropylamide, 2-hydroxy-3-naphthalenesulfonic acid 2-ethylhexyloxypropylamide, 2-hydroxy-3-naphthalenesulfonic acid 2-ethylhexylamide, 5-acetamide-1-naphthol, sodium 1-hydroxy-8-acetamidonaphthalene-3,6-disulfonate, 1-hydroxy-8-acetamidonaphthalene-3,6-disulfonic acid dianilide, 1,5-dihydroxynaphthalene, 2-hydroxy-3-naphthoic acid morpholinopropylamide, 2-hydroxy-3-naphthoic acid octylamide, 2-hydroxy-3-naphthoic acid anilide, 5,5-dimethyl-1,3-cyclohexanedione, 1,3-cyclopentanedione, 5-(2-n-tetradecyloxyphenyl)-1,3-cyclohexanedione, 5-phenyl-4-methoxycarbonyl-1,3-cyclohexanedione, 5-(2,5-di-n-octyloxyphenyl)-1,3-cyclohexanedione, N,N'-dicyclohexylbarbituric acid, N,N'-di-n-dodecylbarbituric acid, N-n-octyl-N'-n-octadecylbarbituric acid, N-phenyl-N'-(2,5-di-n-octyloxyphenyl)barbituric acid, N,N'-bis(octadecyloxycarbonylmethyl)barbituric acid, 1-phenyl-3-methyl-5-pyrazolone, 1-(2,4,6-trichlorophenyl)-3-anilino-5-pyrazolone, 1-(2,4,6-trichlorophenyl)-3-benzamide-5-pyrazolone, 6-hydroxy-4-methyl-3-cyano-1-(2-ethylhexyl)-2-pyridone, 2,4-bis-(benzoylacetamide)toluene, 1,3-bis (pivaloylacetamidemethyl)benzene, benzoylacetonitrile, thenoylacetonitrile, acetoacetanilide, benzoylacetanilide, pivaloylacetanilide, 2-chloro-5-(N-n-butylsulfamoyl)-1-pivaloylacetamidebenzene, 1-(2-ethylhexyloxypropyl)-3-cyano-4-methyl-6-hydroxy-1,2-dihydropyridine-2-one, 1-(dodecyloxypropyl)-3-acetyl-4-methyl-6-hydroxy-1,2-dihydropyridine-2-one, and 1-(4-n-octyloxyphenyl)-3-tert-butyl-5-aminopyrazole.

The known coupler compounds are specifically disclosed in JP-A Nos. 4-201483, 7-223367, 7-223368, 7-323660, 7-125446, 7-096671, 7-223367, 7-223368, 9-156229, 9-216468, and 9-216469, Japanese Patent Application No. 8-030799, and JP-A Nos. 9-203472, 9-319025, 10-035113, 10-193801, and 10-264532.

The total solid (mass) content of the coupler compound in the recording layer is preferably from 0.02 to 5 $g/m^2$, more preferably from 0.1 to 4 $g/m^2$. If the total content of the coupler compound is in the range of 0.02 to 5 $g/m^2$, reduction in both color formation density and application suitability in the recording material of the invention can be prevented.

The known coupler compound may be used at any amount as long as it does not ruin the effect of the invention. For example, the content of the known coupler compound is preferably from 0 to 75% by mass to total (mass) amount of coupler compounds.

Diazo Compound

At least one diazo compound included in the recording layer of the recording material of the invention is preferably a compound represented by the following general formula (2) (a benzotriazinone type diazo compound). In particular, this diazo compound may be used in combination with the coupler compound of the invention (the compound represented by the general formula (1)) to produce a high-quality color ranging from violet to cyan hues and provide good coloring properties.

General formula (2)

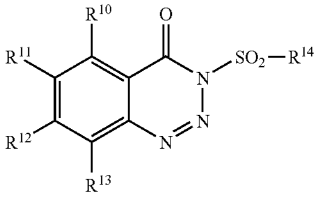

wherein $R^{10}$, $R^{11}$, $R^{12}$, and $R^{13}$ each independently represent a hydrogen atom, a halogen atom, an alkyl group, an aryl group, an alkoxy group, an aryloxy group, an alkylthio group, an arylthio group, an alkylsulfonyl group, an arylsulfonyl group, an alkoxycarbonyl group, an aryloxycarbonyl group, an acyloxy group, an acyl group, a carbamoyl group, an acylamino group, a sulfamoyl group, a sulfonamide group, a cyano group, or a nitro group; and $R^{14}$ represents an alkyl group or an aryl group.

The halogen atom represented by $R^{10}$, $R^{11}$, $R^{12}$, or $R^{13}$ is preferably a fluorine atom, a chlorine atom, a bromine atom, or an iodine atom, particularly preferably a chlorine atom or a bromine atom.

The alkyl group represented by $R^{10}$, $R^{11}$, $R^{12}$, or $R^{13}$ may be unsubstituted or substituted. The alkyl group preferably has 1 to 30 total carbon atoms. Preferred examples of the alkyl group include methyl, ethyl, n-propyl, isopropyl, n-butyl, tert-butyl, n-hexyl, n-heptyl, n-octyl, 2-ethylhexyl, 3,5,5-trimethylhexyl, n-dodecyl, cyclohexyl, benzyl, α-methylbenzyl, allyl, 2-chloroethyl, 2-methoxyethyl, 2-ethoxyethyl, 2-phenoxyethyl, 2-(2,5-di-tert-amylphenoxy)ethyl, 2-benzoyloxyethyl, methoxycarbonylmethyl, methoxycarbonyl-ethyl, butoxycarbonylethyl, 2-isopropyloxyethyl, 2-methanesulfonylethyl, 2-ethoxycarbonylmethyl, 1-(4-methoxyphenoxy)-2-propyl, trichloromethyl, and trifluoromethyl.

In particular, the alkyl group more preferably has 1 to 12 total carbon atoms. Particularly preferred examples of the alkyl group include methyl, ethyl, tert-butyl, n-butyl, n-heptyl, n-octyl, and n-dodecyl.

The aryl group represented by $R^{10}$, $R^{11}$, $R^{12}$, or $R^{13}$ may be unsubstituted or substituted. The aryl group preferably has 6 to 30 total carbon atoms. Preferred examples of the aryl group include phenyl, 4-methylphenyl, 3-methylphenyl, 2-methylphenyl, 4-chlorophenyl, and 2-chlorophenyl.

In particular, the aryl group more preferably has 6 to 18 total carbon atoms. Particularly preferred examples of the aryl group include phenyl, 2-methylphenyl and 2-chlorophenyl.

The alkoxy group represented by $R^{10}$, $R^{11}$, $R^{12}$, or $R^{13}$ may be unsubstituted or substituted. The alkoxy group preferably has 1 to 20 total carbon atoms. Preferred examples of the alkoxy group include methoxy, ethoxy, n-propyloxy, isopropyloxy, n-butyloxy, tert-butyloxy, n-hexyloxy, n-octyloxy, 2-ethylhexyloxy, 3,5,5-trimethylhexyloxy, n-dodecyloxy, cyclohexyloxy, benzyloxy, allyloxy, 2-methoxyethoxy, 2-ethoxyethoxy, 2-phenoxyethoxy, 2-(2,5-di-tert-amylphenoxy)ethoxy, 2-benzoyloxyethoxy, methoxycarbonylmethyloxy, methoxycarbonylethyloxy, butoxycarbonylethyloxy, and 2-isopropyloxyethyloxy.

In particular, the alkoxy group more preferably has 1 to 12 total carbon atoms. Particularly preferred examples of the alkoxy group include methoxy, ethoxy, n-butyloxy, and 2-ethylhexyloxy.

The aryloxy group represented by $R^{10}$, $R^{11}$, $R^{12}$, or $R^{13}$ may be unsubstituted or substituted. The aryloxy group preferably has 6 to 20 total carbon atoms. Preferred examples of the aryloxy group include phenoxy, 4-methylphenoxy, 2-methylphenoxy, and 2-chlorophenoxy.

In particular, the aryloxy group more preferably has 6 to 18 total carbon atoms. Particularly preferred examples of the aryloxy group include phenoxy and 2-methylphenoxy.

The alkylthio group represented by $R^{10}$, $R^{11}$, $R^{12}$, or $R^{13}$ may be unsubstituted or substituted. The alkylthio group preferably has 1 to 20 total carbon atoms. Preferred examples of the alkylthio group include methylthio, ethylthio, n-butylthio, tert-butylthio, n-hexylthio, n-octylthio, 2-ethylhexylthio, n-dodecylthio, cyclohexylthio, benzylthio, and ethoxycarbonylmethylthio.

In particular, the alkylthio group more preferably has 1 to 12 total carbon atoms. Particularly preferred examples of the alkylthio group include methylthio, ethylthio, n-octylthio, and cyclohexylthio.

The arylthio group represented by $R^{10}$, $R^{11}$, $R^{12}$, or $R^{13}$ may be unsubstituted or substituted. The arylthio group preferably has 6 to 30 total carbon atoms. Preferred examples of the arylthio group include phenylthio, 4-methylphenylthio, 3-methylphenylthio, 2-methylphenylthio, 4-chlorophenylthio, and 2-chlorophenylthio.

In particular, the arylthio group more preferably has 6 to 18 total carbon atoms. Particularly preferred examples of the arylthio group include phenylthio and 2-methylphenylthio.

The alkylsulfonyl group represented by $R^{10}$, $R^{11}$, $R^{12}$, or $R^{13}$ may be unsubstituted or substituted. The alkylsulfonyl group preferably has 1 to 20 total carbon atoms. Preferred examples of the alkylsulfonyl group include methylsulfonyl, ethylsulfonyl, n-butylsulfonyl, n-hexylsulfonyl, n-octylsulfonyl, 2-ethylhexylsulfonyl, n-dodecylsulfonyl, cyclohexylsulfonyl, benzylsulfonyl, and ethoxycarbonylmethylsulfonyl.

In particular, the alkylsulfonyl group more preferably has 1 to 12 total carbon atoms. Particularly preferred examples of the alkylsulfonyl group include methylsulfonyl, ethylsulfonyl and n-dodecylsulfonyl.

The arylsulfonyl group represented by $R^{10}$, $R^{11}$, $R^{12}$, or $R^{13}$ may be unsubstituted or substituted. The arylsulfonyl group preferably has 6 to 30 total carbon atoms. Preferred examples of the arylsulfonyl group include phenylsulfonyl, 4-methylphenylsulfonyl, 3-methylphenylsulfonyl, 2-methylphenylsulfonyl, 4-chlorophenylsulfonyl, and 2-chlorophenylsulfonyl.

In particular, the arylsulfonyl group more preferably has 6 to 18 total carbon atoms. Particularly preferred examples of the arylsulfonyl group include phenylsulfonyl and 2-methylphenylsulfonyl.

The alkoxycarbonyl group represented by $R^{10}$, $R^{11}$, $R^{12}$, or $R^{13}$ may be unsubstituted or substituted. The alkoxycarbonyl group preferably has 2 to 20 total carbon atoms. Preferred examples of the alkoxycarbonyl group include methoxycarbonyl, ethoxycarbonyl, n-propyloxycarbonyl, isopropyloxycarbonyl, n-butyloxycarbonyl, tert-butyloxycarbonyl, n-hexyloxycarbonyl, n-octyloxycarbonyl, 2-ethylhexyloxycarbonyl, 3,5,5-trimethylhexyloxycarbonyl, n-dodecyloxycarbonyl, cyclohexyloxycarbonyl, benzyloxycarbonyl, allyloxycarbonyl, 2-methoxyethoxycarbonyl, 2-ethoxyethoxycarbonyl, 2-phenoxyethoxycarbonyl, 2-(2,5-di-tert-amylphenoxy)ethoxycarbonyl, 2-benzoyloxyethoxycarbonyl, methoxycarbonylmethyloxycarbonyl, methoxycarbonylethyloxycarbonyl, butoxycarbonylethyloxycarbonyl, and 2-isopropyloxyethyloxycarbonyl.

In particular, the alkoxycarbonyl group more preferably has 2 to 12 total carbon atoms. Particularly preferred examples of the alkoxycarbonyl group include methoxycarbonyl and n-octyloxycarbonyl.

The aryloxycarbonyl group represented by $R^{10}$, $R^{11}$, $R^{12}$ or $R^{13}$ may be unsubstituted or substituted. The aryloxycarbonyl group preferably has 7 to 20 total carbon atoms. Preferred examples of the aryloxycarbonyl group include phenoxycarbonyl, 4-methylphenoxycarbonyl, 2-methylphenoxycarbonyl, and 2-chlorophenoxycarbonyl.

In particular, the aryloxycarbonyl group more preferably has 7 to 12 total carbon atoms. Particularly preferred examples of the aryloxycarbonyl group include phenoxycarbonyl and 2-methylphenoxycarbonyl.

The acyloxy group represented by $R^{10}$, $R^{11}$, $R^{12}$, or $R^{13}$ may be unsubstituted or substituted. The acyloxy group preferably has 2 to 20 total carbon atoms. Preferred examples of the acyloxy group include acetyloxy, propanoyloxy, butanoyloxy, hexanoyloxy, octanoyloxy, 2-ethylhexanoyloxy, dodecanoyloxy, benzoyloxy, 4-methoxybenzoyloxy, 2-methoxybenzoyloxy, 4-chlorobenzoyloxy, 2-cholorobenzoyloxy, 4-methylbenzoyloxy, and 2-methylbenzoyloxy.

In particular, the acyloxy group more preferably has 2 to 12 total carbon atoms. Particularly preferred examples of the acyloxy group include acetyloxy and 2-ethylhexanoyloxy.

The acyl group represented by $R^{10}$, $R^{11}$, $R^{12}$, or $R^{13}$ may be unsubstituted or substituted. The acyl group preferably has 2 to 20 total carbon atoms. Preferred examples of the acyl group include acetyl, propanoyl, butanoyl, hexanoyl, octanoyl, 2-ethylhexanoyl, benzoyl, and 2-methylbenzoyl.

In particular, the acyl group more preferably has 2 to 12 total carbon atoms. Particularly preferred examples of the acyl group include acetyl, octanoyl and 2-methylbenzoyl.

The carbamoyl group represented by $R^{10}$, $R^{11}$, $R^{12}$, or $R^{13}$ may be unsubstituted or substituted. The carbamoyl group preferably has 1 to 30 total carbon atoms. Preferred examples of the carbamoyl group include unsubstituted carbamoyl, N-methylcarbamoyl, N,N-dimethylcarbamoyl, N,N-diethylcarbamoyl, N,N-dibutylcarbamoyl, morpholinocarbonyl, and piperidinocarbonyl.

In particular, the carbamoyl group more preferably has 1 to 12 total carbon atoms. N,N-dimethylcarbamoyl and N,N-dibutylcarbamoyl are particularly preferred.

The acylamino group represented by $R^{10}$, $R^{11}$, $R^{12}$, or $R^{13}$ may be unsubstituted or substituted. The acylamino group preferably has 2 to 20 total carbon atoms. Preferred examples of the acylamino group include acetylamino, propanoylamino, butanoylamino, hexanoylamino, octanoylamino, 2-ethylhexanoylamino, benzoylamino, 4-methoxybenzoylamino, N-methylacetylamino, N-methylbenzoylamino, and 2-oxapyrrolidino.

In particular, the acylamino group more preferably has 2 to 12 total carbon atoms. Particularly preferred examples of the acylamino group include acetylamino and octanoylamino.

The sulfamoyl group represented by $R^{10}$, $R^{11}$, $R^{12}$, or $R^{13}$ may be unsubstituted or substituted. The sulfamoyl group preferably has 1 to 30 total carbon atoms. Preferred examples of the sulfamoyl group include unsubstituted sulfamoyl, N-methylsulfamoyl, N,N-dimethylsulfamoyl, N,N-diethylsulfamoyl, N,N-dibutylsulfamoyl, morpholinosulfonyl, and piperidinosulfonyl.

In particular, the sulfamoyl group more preferably has 1 to 12 total carbon atoms. N,N-dimethylsulfamoyl and N,N-dibutylsulfamoyl are particularly preferred.

The sulfonamide group represented by $R^{10}$, $R^{11}$, $R^{12}$, or $R^{13}$ may be unsubstituted or substituted. The sulfonamide group preferably has 1 to 20 total carbon atoms. Preferred examples of the sulfonamide group include methanesulfonamide, ethanesulfonamide, butanesulfonamide, hexanesulfonamide, benzenesulfonamide, 4-methoxybenzenesulfonamide, and N-methylmethanesulfonamide.

In particular, the sulfonamide group more preferably has 1 to 12 total carbon atoms. Particularly preferred examples of the sulfonamide group include methanesulfonamide and butanesulfonamide.

In particular, $R^{10}$, $R^{11}$, $R^{12}$, or $R^{13}$ is preferably a hydrogen atom, a halogen atom, an alkylsulfonyl group, an arylsulfonyl group, an acyl group, a cyano group, or a nitro group.

The alkyl group represented by $R^{14}$ may be unsubstituted or substituted. Preferred examples of the alkyl group include methyl, ethyl, n-propyl, isopropyl, n-butyl, tert-butyl, n-hexyl, n-octyl, 2-ethylhexyl, dodecyl, 3,5,5-trimethylhexyl, n-dodecyl, cyclohexyl, benzyl, α-methylbenzyl, allyl, 2-methanesulfonylethyl, 2-isopropyloxyethyl, 2-(2,5-di-tert-amylphenoxy)ethyl, 2-phenoxyethyl, and 1-(4-methoxyphenoxy)-2-propyl. And 2-ethylhexyl and n-dodecyl are particularly preferred.

The aryl group represented by $R^{14}$ may be unsubstituted or substituted. The aryl group preferably has 6 to 30 total carbon atoms. Preferred examples of the aryl group include phenyl, 4-methylphenyl, 3-methylphenyl, 2-methylphenyl, 4-chlorophenyl, 2-chlorophenyl, 4-dodecylphenyl, 2-n-octyloxy-5-tert-octylphenyl, 2-(n-hexyloxycarbonyl)phenyl, 2-(n-octyloxycarbonyl)phenyl, 2-(2-ethylhexyloxycarbonyl)phenyl, 2-(n-decyloxycarbonyl)phenyl, 3-(n-octyloxycarbonyl)phenyl, 4-(2-ethylhexyloxycarbonyl)phenyl, 2-(2-(4-methoxyphenoxy)ethoxycarbonyl)phenyl, and 2-(2-(4-butoxyphenoxy)ethoxycarbonyl)phenyl.

Particularly preferred examples of the aryl group include 4-dodecylphenyl, 2-n-octyloxy-5-tert-octylphenyl, 2-(n-hexyloxycarbonyl)phenyl, 2-(n-octyloxycarbonyl)phenyl, 2-(2-ethylhexyloxycarbonyl)phenyl, 2-(n-decyloxycarbonyl)phenyl, and 3-(n-octyloxycarbonyl)phenyl.

Of the alkyl and aryl groups represented by $R^{14}$, the aryl group is particularly preferred.

Specific examples of the compound represented by the general formula (2) are shown below (Illustrative Compounds A-1 to A-23). However, such compounds are not intended to limit the scope of the invention.

A-1

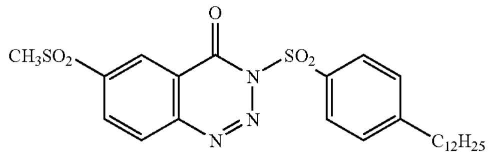

A-2

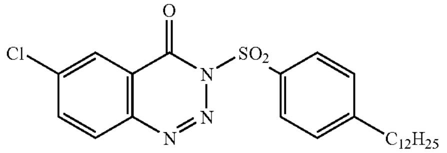

A-3

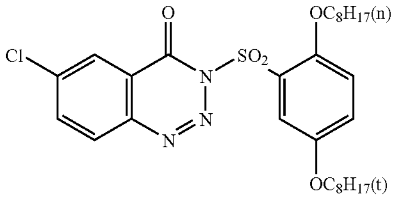

A-4

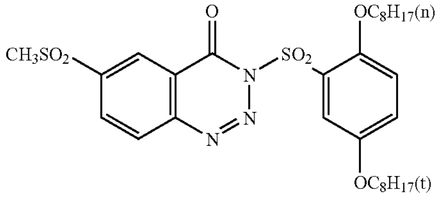

A-5

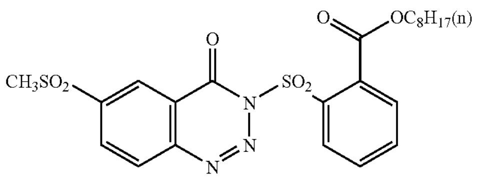

A-6

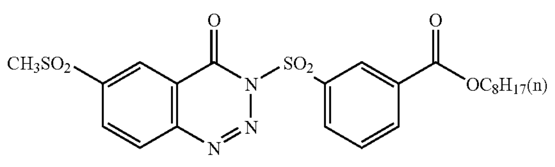

-continued

A-7

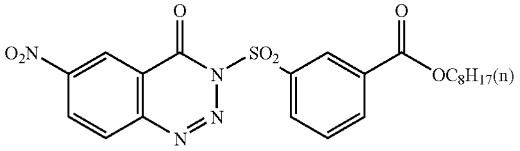

A-8

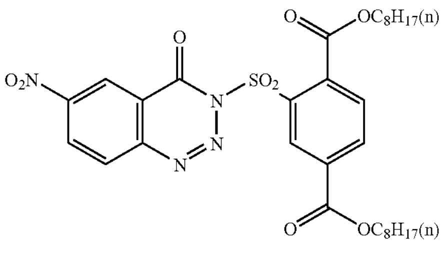

A-9

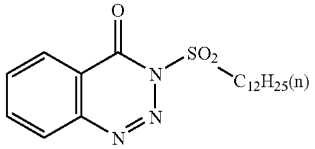

A-10

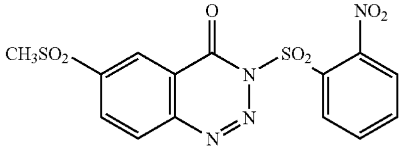

A-11

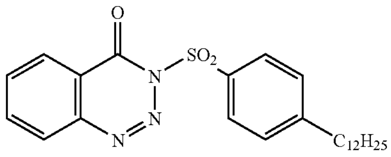

A-12

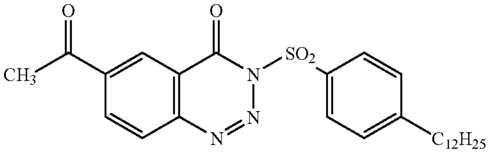

A-13

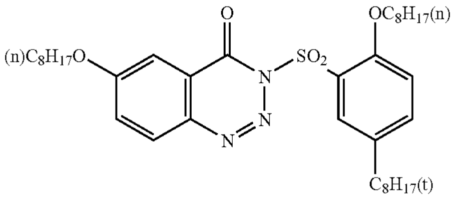

A-14

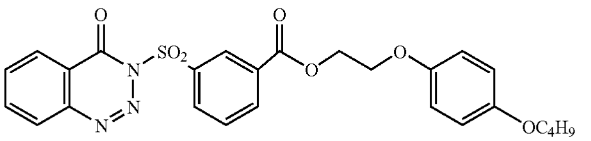

-continued

A-15

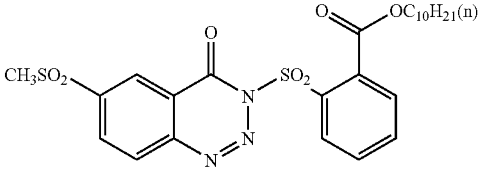

A-16

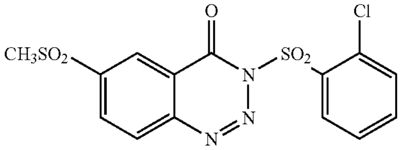

The compound represented by the general formula (2) can appropriately be synthesized according to the process as disclosed in JP-A Nos. 2001-151762 and 2001-139563.

The compound represented by the general formula (2) may be used alone or in combination of plural types. In the present invention, the compound represented by the general formula (2) may be used in combination with any other known diazo compound.

The total solid (mass) content of the above diazo compound in the recording layer is preferably from 0.02 to 5 $g/m^2$, more preferably from 0.1 to 4 $g/m^2$. If the total content of the diazo compound is in the range of 0.02 to 5 $g/m^2$, a reduction in color formation density can be prevented and it is economically preferred in terms of cost.

The known diazo compound may be used at any content that does not ruin the effect of the invention. For example, the content of the known diazo compound is preferably 0 to 50% by mass of the total (mass) content of the diazo compounds.

Metal Salt

In the present invention, the recording layer includes the metal salt together with the coupler compound and the diazo compound. In the present invention, the metal salt can react with the coupler and diazo compounds to form an azo dye.

In the present invention, the metal salt is preferably bivalent. Examples of the metal salt of the present invention include zinc sulfate, zinc chloride, zinc 2-ethylhexanoate, copper sulfate, manganese chloride, aluminum sulfate, nickel chloride, cobalt chloride, and iron nitrate. Zinc 2-ethylhexanoate, zinc sulfate and zinc chloride are particularly preferred.

In the present invention, the metal salt may be used alone or in combination of plural types.

The solid (mass) content of the metal salt in the recording layer is preferably from 0.002 to 5 $g/m^2$, more preferably from 0.01 to 4 $g/m^2$. At a content in the range of 0.002 to 5 $g/m^2$, the color hue can be prevented from being unclear, and the coating solution can be prevented from having an increased viscosity so that application can be easy to perform.

Other Components

In the present invention, an organic base is preferably added for the purpose of accelerating the coupling reaction between the diazo compound and the coupler compound.

The recording layer preferably includes the organic base together with the diazo compound and the coupler compound. The organic base may be used alone or in combination of plural types.

Examples of the organic base include nitrogen-including compounds such as tertiary amines, piperidines, piperazines, amidines, formamidines, pyridines, guanidines, and morpholines. Available examples of the organic base also include those disclosed in Japanese Patent Application Publication (JP-B) No. 52-46806 and JP-A Nos. 62-70082, 57-169745, 60-94381, 57-123086, 58-1347901, and 60-49991, JP-B Nos. 2-24916 and 2-28479, and JP-A Nos. 60-165288 and 57-185430.

Particularly preferred examples of the organic base include piperazines such as N,N'-bis(3-phenoxy-2-hydroxypropyl)piperazine, N,N'-bis[3-(p-methylphenoxy)-2-hydroxypropyl]piperazine, N,N'-bis[3-(p-methoxyphenoxy)-2-hydroxypropyl]piperazine, N,N'-bis(3-phenylthio-2-hydroxypropyl)piperazine, N,N'-bis[3-(β-naphthoxy)-2-hydroxypropyl]piperazine, N-3-(β-naphthoxy)-2-hydroxypropyl-N'-methylpiperazine, 1,4-bis{[3-(N-methylpiperazino)-2-hydroxy]propyloxy}benzene; morpholines such as N-[3-(β-naphthoxy)-2-hydroxy]propylmorpholine, 1,4-bis(3-morpholino-2-hydroxy-propyloxy) benzene, and 1,3-bis(3-morpholino-2-hydroxy-propyloxy) benzene; piperidines such as N-(3-phenoxy-2-hydroxypropyl)piperidine and N-dodecylpiperidine; and guanidines such as triphenylguanidine, tricyclohexylguanidine and dicyclohexylphenylguanidine.

When the organic base is added as needed, the content of the organic base in the recording layer is preferably from 0.1 to 30 parts by mass based on 1 part by mass of the diazo compound.

In the present invention, a coloring aid may also be added to the recording layer for the purpose of accelerating the coloring reaction.

The coloring aid is a substance that can increase the color formation density or lower the minimum coloring temperature at the time of thermal recording. The coloring aid can also lower the melting point of the coupler compound, the organic base or the diazo compound or lower the softening point of the capsule wall so that the diazo compound, the organic base, the coupler compound, and the like can be in a highly reactive state.

Examples of the coloring aid, which can reduce the energy and make thermal printing prompt and complete as mentioned above, include phenol derivatives, naphthol derivatives, alkoxy-substituted benzenes, alkoxysubstituted naphthalenes, aromatic ethers, thioethers, esters, amides, ureides, urethanes, sulfonamide compounds, and hydroxy compounds.

Any known antioxidant or the like may preferably be used for the purpose of involving the light-fading or thermal-fading stability of the color formation image or reducing the light-induced yellowing of the non-printed portion (non-image portion) after fixing.

Examples of the antioxidant include those disclosed in EP Laid-Open Nos. 223739, 309401, 309402, 310551, 310552, and 459416, German Patent Laid-Open No. 3435443, JP-A Nos. 54-48535, 62-262047, 63-113536, 63-163351, 2-262654, 2-271262, 3-121449, 5-61166, and 5-119449, and U.S. Pat. Nos. 4,814,262 and 4,980,275.

Various known additives that have been used in conventional thermal or pressure-sensitive recording materials may also effectively be used in the present invention.

Examples of such an additive include the compounds disclosed in JP-A Nos. 60-107384, 60-107383, 60-125470, 60-125471, 60-125472, 60-287485, 60-287486, 60-287487, 60-287488, 61-160287, 61-185483, 61-211079, 62-146678, 62-146680, 62-146679, 62-282885, 63-051174, 63-89877, 63-88380, 63-088381, 63-203372, 63-224989, 63-251282, 63-267594, 63-182484, 1-239282, 4-291685, 4-291684, 5-188687, 5-188686, 5-110490, 5-1108437, and 5-170361, and JP-B Nos. 48-043294 and 48-033212.

Specifically, the additive may be 6-ethoxy-1-phenyl-2,2,4-trimethyl-1,2-dihydroquinoline, 6-ethoxy-1-octyl-2,2,4-trimethyl-1,2-dihydroquinoline, 6-ethoxy-1-phenyl-2,2,4-trimethyl-1,2,3,4-tetrahydroquinoline, 6-ethoxy-1-octyl-2,2,4-trimethyl-1,2,3,4-tetrahydroquinoline, nickel cyclohexanoate, 2,2-bis(4-hydroxyphenyl)propane, 1,1-bis(4-hydroxyphenyl)-2-ethylhexane, 2-methyl-4-methoxy-diphenylamine, and 1-methyl-2-phenylindole.

The addition amount of the antioxidants or additives as aforementioned is preferably from 0.05 to 100 parts by mass, more preferably from 0.2 to 30 parts by mass, based on 1 part by mass of the diazo compound.

The known antioxidants and the known additives may be included in a microcapsule together with the diazo compound. The known antioxidants and the known additives may also be formed into a solid dispersion together with the coupler compound, the organic base or any other coloring aid, formed into an emulsion together with any appropriate emulsifying aid, or formed into both.

The antioxidant or the additive may be used alone or in combination of plural types. When using two types of the antioxidants or additives in combination, they may be classified structurally, for example, as anilines, alkoxybenzenes, hindered phenols, hindered amines, hydroquinone derivatives, phosphorus compounds, and sulfur compounds, and then two or more antioxidants or additives different in such structure from each other may be used in combination or two or more antioxidants or additives same in such structure may be used in combination.

The antioxidant and the any additive may not be added to the same layer. When a protective layer is formed on the recording layer, the antioxidants and the additives may be added to or allowed to exist in the protective layer.

In order to reduce the yellowing of background portions after recording, a free radical-generating agent which is used in photo-polymerizable compositions may be added to the recording material of the invention. The free radical-generating agent is a compound that can generate a free radical by light radiation.

Examples of the free radical-generating agent include aromatic ketones, quinones, benzoins, benzoin ethers, diazo compounds, organic disulfides, and acyloxime esters. The addition amount of the free radical-generating agent is preferably from 0.01 to 5 parts by mass based on 1 part by mass of the diazo compound.

Similarly, any polymerizable compound having an ethylenic unsaturated bond (hereinafter referred to as the vinyl monomer) may be used for the purpose of reducing the yellowing. The vinyl monomer is a compound that has at least one ethylenic unsaturated bond (such as a vinyl group or a vinylidene group) in its chemical structure. The vinyl monomer has a chemical form of a monomer or prepolymer. Examples of such compounds include unsaturated carboxylic acids and salts thereof; esters of any unsaturated carboxylic acid and any aliphatic polyhydric alcohol; and amides of any unsaturated carboxylic acid and any aliphatic polyamine. The vinyl monomer may be used in an amount of 0.2 to 20 parts by mass based on 1 part by mass of the diazo compound.

The free radical-generating agent or the vinyl monomer may be used together with the diazo compound in a microcapsule.

Any acid stabilizer may also be added, such as citric acid, tartaric acid, oxalic acid, boric acid, phosphoric acid, and pyrophosphoric acid.

A binder such as a known water-soluble polymer and known latex may be used in the recording layer.

Examples of the water-soluble polymer include methylcellulose, carboxymethylcellulose, hydroxyethylcellulose, hydroxypropylcellulose, starch derivatives, casein, gum arabic, gelatin, ethylene-maleic anhydride copolymers, styrene-maleic anhydride copolymers, polyvinyl alcohol, epichlorohydrin-modified polyamides, isobutylene-maleic anhydride salicylic acid copolymers, polyacrylic acid, polyacrylic acid amide, and modifications thereof. Examples of the latex include styrene-butadiene rubber latexes, methyl acrylate-butadiene rubber latexes, and vinyl acetate emulsions.

In the recording material of the invention, the recording layer or any other layer may include any pigment.

Any known organic or inorganic pigment may be used. Examples of the pigment include kaolin, calcined kaolin, talc, agalmatolite, diatomaceous earth, calcium carbonate, aluminum hydroxide, magnesium hydroxide, zinc oxide, lithopone, amorphous silica, colloidal silica, calcined gypsum, silica, magnesium carbonate, titanium oxide, alumina, barium carbonate, barium sulfate, mica, microballoon, a urea-formalin filler, polyester particles, and a cellulose filler.

If necessary, any other additive may be used, such as any known wax, antistatic agent, antifoaming agent, electrically conductive agent, fluorescent dye, surfactant, or ultraviolet absorbing agent or any precursor thereof.

In the present invention, the diazo compound is preferably encapsulated in a microcapsule for the purpose of improving the unprocessed stock storability of the recording material. In particular, the diazo compound and the metal salt are both preferably encapsulated in a microcapsule.

In the case that the recording material of the invention is a thermal recording material, the microcapsule is preferably made of a polymer that is non-permeable to materials at room temperature but which becomes permeable to materials when heated. In particular, the microcapsule is preferably made of a polymer having a glass transition temperature of 60 to 200° C.

Examples of such polymers include polyurethane, polyurea, polyamide, polyester, urea-formaldehyde resin, melamine resin, polystyrene, styrene-methacrylate copolymer, styrene-acrylate copolymer, and any combination thereof. In particular, such a polymer preferably comprises at least one of polyurethane and polyurea.

The microcapsule may appropriately be formed by any known method. In particular, an interfacial or internal polymerization method is suitable as a method for forming the microcapsule. Details of the capsule-forming method and some examples of the reactants are disclosed in U.S. Pat. Nos. 3,726,804 and 3,796,669.

For example, when polyurea or polyurethane is used as a capsule wall material, polyisocyanate and a second substance (for example, polyol or polyamine) that can react with the polyisocyanate to form the capsule wall are mixed in an aqueous solvent or an oily solvent to be encapsulated. They are emulsified in water, and then heated so that a polymer-forming reaction occurs at the oil particle interface to form a microcapsule wall. Even when the addition of the second substance is omitted, polyurea is produced.

An example of a method of producing the diazo compound-containing microcapsules (with a polyurea-polyurethane wall) of the present invention is described below.

First, the diazo compound (preferably together with the metal salt) is dissolved or dispersed in a hydrophobic organic solvent, which will form a capsule core. Such an organic solvent preferably has a boiling point of from 100 to 300° C. Into the organic solvent is further added a multifunctional isocyanate as the wall material (oil phase).

On the other hand, an aqueous solution, in which a water-soluble polymer such as polyvinyl alcohol, gelatin or the like is dissolved, is prepared as the aqueous phase. After the oil phase is added to the aqueous phase, they are emulsified by means of a homogenizer or the like. In this case, the water-soluble polymer serves as a protective colloid to facilitate the emulsification process and to make it uniform. The water-soluble polymer also functions as a dispersing medium that can stabilize the emulsion. In order to performing the emulsification in a more stable manner, any surfactant may be added to at least one of the oil phase and the aqueous phase.

The amount of the multifunctional isocyanate to be used is determined so as to provide with the microcapsule an average particle diameter of 0.3 to 12 μm and a wall thickness of 0.01 to 0.3 μm. The dispersed particle size is generally from about 0.2 to 10 μm. In the emulsion, a polymerization reaction of the multifunctional isocyanate occurs at the interface between the oil phase and the aqueous phase to form a polyurea wall.

A polyol that is added in advance to the aqueous phase can also react with the multifunctional isocyanate to form a polyurethane wall.

In order to speed up the rate of reaction, a high reaction temperature may preferably be maintained or any appropriate polymerization catalyst may preferably be added.

The multifunctional isocyanate, the polyol, the reaction catalyst, the polyamine for forming part of the wall material, and the like are described in detail, for example, in a text, "Polyurethane Handbook" edited by Keiji Iwata and published by The Nikkan Kogyo Shimbun, Ltd. (1987).

The multifunctional isocyanate used for the microcapsule wall material is preferably a compound having a tri-functional or more multi-functional isocyanate group. However, any difunctional isocyanate compounds may be used in combination as the multifunctional isocyanate. Examples of multifunctional isocyanates include a compound mainly produced from a diisocyanate such as xylene diisocyanate or any hydrogenated product thereof, hexamethylene diisocyanate, tolylene diisocyanate or any hydrogenated product thereof, and isophorone diisocyanate, and any dimer or trimer thereof (biulets and isocyanurates); a multifunctional adduct of a polyol such as trimethylolpropane and a difunctional isocyanate such as xylylene diisocyanate; a compound which is produced by a process including the steps of forming an adduct of a polyol such as trimethylolpropane and a difunctional isocyanate such as xylylene diisocyanate and introducing a high-molecular weight compound such as a polyether having an active hydrogen (such as polyethyleneoxide) into the adduct; and formalin-benzene isocyanate condensates.

Some preferred examples of multifunctional isocyanates are disclosed in JP-A Nos. 62-212190, 4-26189, 5-317694, and 10-14153.

A polyol or a polyamine may also be added in advance to the hydrophobic solvent for the core, or to the solution of the water-soluble polymer for the dispersing medium and used as one of the materials for the microcapsule wall. Examples of the polyol and the polyamine include propylene glycol, glycerin, trimethylolpropane, triethanolamine, sorbitol, and hexamethylenediamine. When a polyol is added, a polyurethane wall is formed.

A hydrophobic organic solvent may be used in the process of dissolving or dispersing the diazo compound and forming the core of the microcapsule. Preferred examples of such hydrophobic organic solvents include alkyl naphthalene, alkyl diphenylethane, alkyl diphenylmethane, alkyl biphenyl, alkyl terphenyl, chlorinated paraffin, phosphate esters, maleate esters, adipate esters, phthalate esters, benzoate esters, carbonate esters, ethers, sulfate esters, and sulfonate esters, and any other organic solvents such as acrylate esters and methacrylate esters.

When the diazo compound to be encapsulated has a low degree of solubility in such a solvent, any low-boiling point solvent, in which the diazo compound to be used can have a high degree of solubility, may secondarily be used in combination.

In a preferred mode, therefore, the diazo compound has an appropriate degree of solubility in the high-boiling point hydrophobic organic solvent and the auxiliary low-boiling point solvent. In particular, the diazo compound preferably has a solubility of 5% or more in such solvents. Moreover the diazo compound preferably has a solubility of 1% or less in water.

Examples of low-boiling point solvents include ethyl acetate, butyl acetate, methylene chloride, tetrahydrofuran, acetonitrile, and acetone.

The water-soluble polymer can be used as a protective colloid in the aqueous phase (the aqueous solution of the water-soluble polymer) in which the oil phase is dispersed. Such a water-soluble polymer preferably has a solubility of at least 5% in water at the temperature at which the emulsification process is undertaken. Examples of such water-soluble polymers include those described below.

The water-soluble polymer can be appropriately selected from known anionic polymers, known nonionic polymers and known amphoteric polymers.

The anionic polymers for use may be natural or synthetic, for example, including those having a linking group such as —COO— and —$SO_2$—.

Examples of the anionic polymers include natural products such as casein, gum arabic, alginic acid, and pectin; semisynthetic products such as carboxymethylcellulose, gelatin derivatives such as phthalated gelatin, starch derivatives such as sulfated starch, sulfated cellulose, and lignin sulphonic acid; and synthetic products such as maleic anhydride-based copolymers (including hydrolysates) such as styrene-maleic anhydride copolymers, ethylene-maleic anhydride copolymers and isobutylene-maleic anhydride copolymers, acrylic acid-based (or methacrylic acid-based) polymers or copolymers such as polyacrylic acid amide and derivatives thereof, ethylene-acrylic acid copolymers, and vinyl acetate-acrylic acid copolymers, ethylene-vinyl acetate copolymers, vinylbenzenesulfonic acid-based polymers or copolymers, and carboxy-modified polyvinyl alcohol.

Examples of the nonionic polymers include polyvinyl alcohol and modifications thereof, polyvinyl pyrrolidone, hydroxyethylcellulose, and methylcellulose. The amphoteric polymers include gelatin and the like.

Particularly preferred examples of the polymer compounds include gelatin, gelatin derivatives and polyvinyl alcohol.

The water-soluble polymer may be used at a concentration of 0.01 to 10% by mass in an aqueous solution.

Preferably, the water-soluble polymers have no or low reactivity with the isocyanate compound. For example, therefore, such polymers as gelatin that has a reactive amino group in its molecular chain should be modified in advance to have no reactivity.

The surfactant for use may appropriately be selected from anionic or nonionic surfactants so as to cause no precipitation or aggregation with the water-soluble polymer. Particularly preferred examples of such surfactants include sodium alkylbenzene sulfonate, sodium alkyl sulfate, sodium dioctyl sulfosuccinate, and polyalkylene glycol (such as polyoxyethylene nonylphenyl ether).

The addition amount of the surfactant may be from 0.1 to 5%, particularly preferably from 0.5% to 2% by mass of the oil phase.

The emulsification may be performed using any known emulsifying apparatus such as a homogenizer, a Manton-Gaulin, an ultrasonic disperser, a dissolver, and a Kdmill.

After the emulsification, the emulsion may be heated to a temperature of from 30 to 70° C. so that the capsule wall-forming reaction can be accelerated. In order to prevent the aggregation of the capsules during the reaction, water should be added to lower the possibility of collision of the capsules, or sufficient stirring or the like should be preformed.

During the reaction, a dispersant may also be added to prevent the aggregation. As the polymerization reaction proceeds, carbon dioxide gas is produced and observed. When the production of the gas comes to an end, the capsule wall-forming reaction may be considered to be finished. Generally, the desired diazo compound-containing microcapsules can be obtained after the reaction for several hours.

In the present invention, if necessary, the coupler compound may be solid-dispersed together with the organic base or any other coloring aid and the water-soluble polymer using a sand mill or the like before use. In a preferred mode, the coupler compound is dissolved in an organic solvent that is hardly soluble or insoluble in water, and then the solution is mixed with an aqueous phase containing at least one of the surfactant and the water-soluble polymer as a protective colloid, so that an emulsion is formed. The surfactant is preferably used to facilitate emulsification and dispersion.

For example, the organic solvent that is hardly soluble or insoluble in water may suitably be selected from the high boiling point oils disclosed in JP-A No. 2-141279.

Particularly in terms of the emulsification stability of the emulsion, the esters are preferred, and tricresyl phosphate is more preferred.

The disclosed oils may be used in combination with each other, or the disclosed oil may be used in combination with any other oil.

An auxiliary solvent of low boiling point, as a dissolving aid, so may also be added to the organic solvent. Preferred examples of auxiliary solvents of low boiling point include ethyl acetate, isopropyl acetate, butyl acetate, and methylene chloride. In some cases, auxiliary solvents of low boiling point may only be used without the high-boiling point oil.

The recording material of the invention may be produced by a process including the steps of preparing a coating solution (a recording layer coating solution) that includes the diazo compound-containing microcapsules, the coupler compound and the metal salt, and optionally at least one of the organic base and any other additive, applying the coating solution onto a support such as a paper product and a synthetic resin film by any known application method, and drying the coating. The solid (mass) content of the recording layer is preferably from 2.5 to 30 $g/m^2$.

Examples of the application method include bar coating, blade coating, air knife coating, gravure coating, roll coating, spray coating, dip coating, curtain coating, or the like.

In the recording material of the invention, the microcapsules, the coupler compound, the organic base, and the like may be included in the same layer or included in different layers to form a layered structure. As disclosed in Japanese Patent Application No. 59-177669, an intermediate layer may be formed on the support, and then the recording layer may be formed by application.

If necessary, a protective layer may also be formed on the recording layer in the recording material of the invention. The protective layer may be formed by stacking two or more layers as needed.

Examples of the material for the protective layer include water-soluble polymer compounds such as polyvinyl alcohol, carboxy-modified polyvinyl alcohol, vinyl acetate-acrylamide copolymers, silicon-modified polyvinyl alcohol, starch, modified starch, methylcellulose, carboxymethylcellulose, hydroxymethylcellulose, gelatins, gum arabic, casein, hydrolysates of styrene-maleic acid copolymers, half ester hydrolysates of styrene-maleic acid copolymers, hydrolysates of isobutylene-maleic anhydride copolymers, polyacrylamide derivatives, polyvinyl pyrrolidone, sodium polystyrene sulfonate, and sodium alginate; and latexes such as styrene-butadiene rubber latexes, acrylonitrile-butadiene rubber latexes, methyl acrylate-butadiene rubber latexes, and vinyl acetate emulsions. Any crosslinking agent may be added to crosslink the water-soluble polymer compound in the protective layer so that the storage stability can be increased. Any known crosslinking agent may be used. Examples thereof include water-soluble initial condensates such as N-methylolurea, N-methylolmelamine and urea-formalin; dialdehyde compounds such as glyoxal and glutaraldehyde; inorganic crosslinking agents such as boric acid and borax; and polyamide epichlorohydrin.

The protective layer may further include any known pigment, metallic soap, wax, surfactant, or ultraviolet absorbing agent, or any precursor thereof.

A process including the steps of preparing a coating solution (a protective layer coating solution) that contains the above components and applying and drying the coating solution may form the protective layer. The protective layer coating solution is preferably applied in an amount (a solid content) of 0.2 to 5 g/m$^2$, more preferably 0.5 to 2 g/m$^2$. The protective layer preferably has a thickness of 0.2 to 5 μm, more preferably 0.5 to 2 μm.

Support

Any paper support that has been used for conventional pressure-sensitive papers, thermal recording papers, or wet or dry type diazo copying papers may be used in the present invention. Other examples of the available support include acid papers, alkaline papers, coated papers, plastic film-laminated papers, synthetic papers, and plastic films.

A back coat layer may be provided for the purpose of correcting the curl valance of the support or increasing the chemical resistance of the backside. A release paper may be combined with the backside of the support via an adhesive layer to form a label. The back coat layer may be formed in a similar manner to the process of the protective layer.

As described above, the recording material of the invention includes a combination of the coupler compound represented by the general formula (1), the diazo compound and the metal salt and therefore can form a cyan coloring substance and provide good color formation in the color hues ranging from violet to cyan.

EXAMPLES

The present invention is further described by showing the examples below, but such examples are not intended to limit the scope of the invention.

Example 1

Preparation of Microcapsule Solution A

To 20.0 g of ethyl acetate were added 2.3 g of a diazo compound (above Illustrative Compound A-5) as a core material, 1.9 g of zinc 2-ethylhexanoate (70% by mass content, manufactured by Tokyo Kasei Kogyo Co., Ltd.) and 10.0 g of tricresyl phosphate and mixed uniformly. To the mixture was then added 14.0 g of a wall agent of a xylylenediisocyanate/trimethylolpropane adduct (trade name: Takenate D110N, manufactured by Mitsui Takeda Chemicals Inc.) and mixed uniformly to prepare a mixture I.

The mixture I was then added to an aqueous solution that comprised 52.0 g of an aqueous 8% by mass phthalated gelatin solution, 18.0 g of water and 0.34 g of an aqueous 10% by mass sodium dodecylbenzenesulfonate solution. A homogenizer was used to emulsify the mixture at 10000 rpm at 40° C. for 10 minutes. To the resulting emulsion were added 54.0 g of water and 0.62 g of tetraethylenepentamine and made uniform. While being stirred, the mixture then underwent a microcapsulating reaction at 65° C. for three hours to prepare Microcapsule Solution A. The resulting microcapsules had an average particle diameter of 0.6 μm.

Preparation of Coupler Compound Emulsion B

Into a mixture of 8.0 g of ethyl acetate, 3.0 g of tetrahydrofuran and 2.0 g of chloroform were dissolved 1.36 g of a coupler compound (above Illustrative Compound B-1), 0.84 g of triphenylguanidine and 1.46 g of tricresyl phosphate to prepare a mixture II. Resulting mixture II was then added to an aqueous phase that was prepared by uniformly mixing, at 40° C., 22.7 g of an aqueous solution containing 15% by mass of an alkali-treated low-ion content gelatin (trade name: #750 gelatin, manufactured by Nitta Gelatin Inc.), 1.4 g of an aqueous 10% by mass sodium dodecylbenzenesulfonate solution and 25 g of water. A homogenizer was used to emulsify the mixture at 9000 rpm at room temperature (about 20° C.) for 10 minutes. The resulting emulsion was stirred at 40° C. for two hours so that the ethyl acetate was removed. To the emulsion, water was then added in an amount equal to the mass of the evaporated ethyl acetate and water, so that a Coupler Compound Emulsion B was obtained.

Preparation of Coating Solution C for Thermal Recording Layer

At 40° C., 2.6 g of resulting Microcapsule Solution A, 1.0 g of water and 1.45 g of an aqueous solution containing 15% by mass of a gelatin (trade name: #761 gelatin, manufactured by Nitta Gelatin Inc.) were mixed uniformly. Thereafter, 6.1 g of Coupler Compound Emulsion B was added and mixed uniformly so that a Coating Solution C for Thermal Recording Layer was obtained.

Preparation of Coating Solution D for Protective Layer

A Coating Solution D for Protective Layer was obtained by uniformly mixing 32 g of an aqueous solution containing 10% by mass of a polyvinyl alcohol (1700 in degree of polymerization and 88% in degree of saponification) and 36 g of water.

Production of Thermal Recording Material

Resulting Coating Solution C for Thermal Recording Layer and Coating Solution D for Protective Layer were applied in order onto the surface of a support for a photographic printing paper using a wire bar. The support comprised a high quality paper and polyethylene laminated thereon. Thereafter, the layers on the support were dried at 50° C. to obtain a recording material (1) of the present invention. In this process, the application amounts (solid contents) of the thermal recording layer and the protective layer were 3.3 g/$m^2$ and 1.05 g/$m^2$, respectively.

Example 2

The process of Example 1 was used to produce a recording material (2) of the present invention except that Illustrative Compound B-3 was used in place of the coupler compound (Illustrative Compound B-1) to form Coupler Compound Emulsion B.

Example 3

The process of Example 1 was used to produce a recording material (3) of the present invention except that Illustrative Compound A-21 was used in place of the diazo compound (Illustrative Compound A-5) to form Microcapsule Solution A.

Example 4

The process of Example 1 was used to produce a recording material (4) of the present invention except that Illustrative Compound A-23 was used in place of the diazo compound (Illustrative Compound A-5) to form Microcapsule Solution A.

Example 5

The process of Example 1 was used to produce a recording material (5) of the present invention except that zinc dibutyldithiocarbamate was used in place of the metal salt (zinc 2-ethylhexanoate) to form Microcapsule Solution A.

Comparative Example 1

The process of Example 1 was used to produce a comparative recording material (1) except that 2-ethylhexanoic acid was used in place of the metal salt (zinc 2-ethylhexanoate) to form Microcapsule Solution A.

Evaluation

The resulting recording materials (1) and (2) of the present invention and the resulting comparative recording material (1) were evaluated as shown below. The result of the evaluation is shown in Table 1 below.

Measurement of Color Formation Density and Color Formation Efficiency

A thermal head (trade name: KST Model, manufactured by Kyocera Corporation) was used to apply recording energy to each recording material. In the printing process, the voltage applied to the thermal head and the pulse width were controlled so as to provide an amount of recording energy per unit area in the range from 0 to 40 mJ/$mm^2$. As a result, the recording material formed a cyan color.

The color formation density in the printed portion was measured using a Macbeth reflection densitometer (trade name: RD918, manufactured by Macbeth). The color formation density was used as an index for evaluating color formation efficiency. A higher color formation density means a higher efficiency of color formation.

Evaluation of Color Hue

In the portion (of a yellow color) printed as shown above, the color hue was visually evaluated.

TABLE 1

| | Diazo Compound | Coupler Compound | Metal Salt | Color formation density | Hue |
|---|---|---|---|---|---|
| Example 1 | A-5 | B-1 | Zinc 2-Ethylhexanoate | 1.5 | Cyan |
| Example 2 | A-5 | B-3 | Zinc 2-Ethylhexanoate | 1.4 | Cyan |
| Example 3 | A-21 | B-1 | Zinc 2-Ethylhexanoate | 1.2 | Cyan |
| Example 4 | A-23 | B-1 | Zinc 2-Ethylhexanoate | 1.3 | Cyan |
| Example 5 | A-5 | B-1 | zinc dibutyl-dithiocarbamate | 0.9 | Cyan |
| Comparative Example 1 | A-5 | B-1 | — | 0.1 | Brown |

The result in Table 1 shows that each recording material of the present invention, which uses a combination of the defined coupler compound, the diazo compound and the metal salt, can be superior in color formation efficiency of the cyan pigment and can form a cyan image of a good color hue.

In contrast, the comparative recording material with no metal salt did not produce a good cyan color hue.

In the present invention, a recording material can be provided which can produce an image of a good color hue from violet to cyan.

What is claimed is:

1. A recording material comprising: on a support, a recording layer including a diazo compound, a coupler compound that can react with the diazo compound to form a color, and a metal salt, wherein the coupler compound is represented by the general formula (1):

General formula (1)

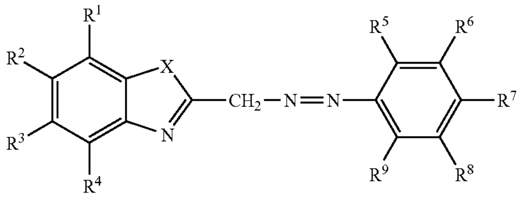

wherein $R^1$, $R^2$, $R^3$, and $R^4$ each independently represent a hydrogen atom, an alkyl group, an aryl group, an alkoxy group, or an amino group; $R^5$, $R^6$, $R^7$, $R^8$, and $R^9$ each independently represent one selected from the group consisting of a hydrogen atom, a halogen atom, an alkyl group, an aryl group, an alkoxy group, an alkoxycarbonyl group, and an acyl group; any of $R^1$ to $R^9$ may have a substituent; and X represents an oxygen atom or a sulfur atom.

2. The recording material according to claim 1, wherein at least one of $R^1$, $R^2$, $R^3$, and $R^4$ in the general formula (1) is a hydrogen atom, an alkyl group or an alkoxy group.

3. The recording material according to claim 1, wherein at least one of $R^1$, $R^2$, $R^3$, and $R^4$ in the general formula (1) is a hydrogen atom or an alkoxy group.

4. The recording material according to claim 1, wherein at least one of $R^5$, $R^6$, $R^7$, $R^8$, and $R^9$ in the general formula (1) is a hydrogen atom, a halogen atom, an alkyl group, an aryl group, or an alkoxy group.

5. The recording material according to claim 1, wherein the coupler compound has a solid content of 0.02 g/$m^2$ to 5 g/$m^2$.

6. The recording material according to claim 1, wherein the diazo compound is a compound represented by the following the general formula (2):

General formula (2)

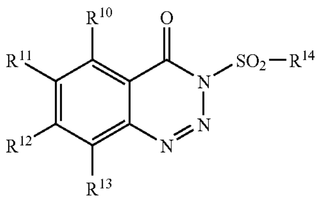

wherein $R^{10}$, $R^{11}$, $R^{12}$, and $R^{13}$ each independently represent a hydrogen atom, a halogen atom, an alkyl group, an aryl group, an alkoxy group, an aryloxy group, an alkylthio group, an arylthio group, an alkylsulfonyl group, an arylsulfonyl group, an alkoxycarbonyl group, an aryloxycarbonyl group, an acyloxy group, an acyl group, a carbamoyl group, an acylamino group, a sulfamoyl group, a sulfonamide group, a cyano group, or a nitro group; and $R^{14}$ represents an alkyl group or an aryl group.

7. The recording material according to claim 6, wherein at least one of $R^{10}$, $R^{11}$, $R^{12}$, and $R^{13}$ in the general formula (2) is a hydrogen atom, a halogen atom, an alkylsulfonyl group, an arylsulfonyl group, an acyl group, a cyano group, or a nitro group.

8. The recording material according to claim 1, wherein the diazo compound has a solid content of 0.02 g/$m^2$ to 5 g/$m^2$.

9. The recording material according to claim 1, wherein the metal salt is a divalent metal salt.

10. The recording material according to claim 1, wherein the metal salt is at least one selected from the group consisting of zinc sulfate, zinc chloride, zinc 2-ethyihexanoate, copper sulfate, manganese chloride, aluminum sulfate, nickel chloride, cobalt chloride, and iron nitrate.

11. The recording material according to claim 1, wherein the metal salt is at least one selected from the group consisting of zinc 2-ethylhexanoate, zinc sulfate and zinc chloride.

12. The recording material according to claim 1, wherein the metal salt has a solid content of 0.002 g/$m^2$ to 5 g/$m^2$.

13. The recording material according to claim 1, wherein the recording layer is a thermal recording layer in which a color is formed by the application of heat.

14. The recording material according to claim 1, wherein the diazo compound is encapsulated in microcapsules.

15. The recording material according to claim 1, wherein both the diazo compound and the metal salt are encapsulated in microcapsules.

16. The recording material according to claim 15, wherein the microcapsules have a capsule wall comprising at least one of polyurethane and polyurea.

17. The recording material according to claim 1, wherein the recording layer includes an organic base.

18. The recording material according to claim 1, wherein the recording layer includes a coloring aid.

19. The recording material according to claim 1, wherein a protective layer is disposed on the recording layer.

* * * * *